United States Patent [19]
Spitzer

[11] Patent Number: 5,861,929
[45] Date of Patent: Jan. 19, 1999

[54] ACTIVE MATRIX COLOR DISPLAY WITH MULTIPLE CELLS AND CONNECTION THROUGH SUBSTRATE

[75] Inventor: Mark B. Spitzer, Sharon, Mass.

[73] Assignee: Kopin Corporation, Taunton, Mass.

[21] Appl. No.: 970,694

[22] Filed: Nov. 4, 1992

Related U.S. Application Data

[63] Continuation-in-part of Ser. No. 944,207, Sep. 11, 1992, Pat. No. 5,444,557, which is a continuation-in-part of Ser. No. 823,858, Jan. 22, 1992, abandoned, and Ser. No. 872,297, Apr. 22, 1992, Pat. No. 5,317,436, which is a continuation-in-part of Ser. No. 636,602, Dec. 31, 1990, Pat. No. 5,206,749.

[51] Int. Cl.$^6$ .................................................. G02F 1/1347
[52] U.S. Cl. ........................... 349/74; 349/149; 349/152
[58] Field of Search .................... 359/88, 53, 72; 349/74, 149, 152

[56] References Cited

U.S. PATENT DOCUMENTS

| | | | |
|---|---|---|---|
| 4,413,257 | 11/1983 | Kramer et al. | 349/152 |
| 4,699,470 | 10/1987 | McLaughlin et al. | 349/152 |
| 4,727,047 | 2/1988 | Bozler et al. | 437/89 |
| 4,808,983 | 2/1989 | Benjamin et al. | 359/59 |
| 4,878,086 | 10/1989 | Isohata et al. | 355/77 |
| 4,886,343 | 12/1989 | Johnson | 359/53 |
| 4,961,630 | 10/1990 | Bavon et al. | 359/54 |
| 5,020,881 | 6/1991 | Matsuda et al. | 359/79 |
| 5,032,007 | 7/1991 | Silverstein et al. | 359/53 |
| 5,089,810 | 2/1992 | Shapiro et al. | 359/53 |
| 5,206,749 | 4/1993 | Zavracky et al. | 359/74 |
| 5,268,679 | 12/1993 | Shannon | 359/72 |
| 5,347,154 | 9/1994 | Takahashi et al. | 359/87 |
| 5,625,474 | 4/1997 | Aomori et al. | 349/79 |

FOREIGN PATENT DOCUMENTS

| | | | |
|---|---|---|---|
| 63-101830 | 5/1988 | Japan | 359/59 |
| 3-197923 | 8/1991 | Japan | 359/88 |

OTHER PUBLICATIONS

Fujii et al., "A laser–Recrystallization . . . Active Matrix LCD's", IEEE Transactions on Electron devices, vol. 37, No. 1, Jan. 1990, pp. 121–127.

*Primary Examiner*—Anita Pellman Gross
*Assistant Examiner*—Kenneth Parker
*Attorney, Agent, or Firm*—Hamilton, Brook, Smith & Reynolds, PC

[57] ABSTRACT

A color active matrix display system including a plurality of active matrix arrays that are stacked around a liquid crystal material, vertically aligned and interconnected to provide a high resolution color display system.

12 Claims, 3 Drawing Sheets

ACTIVE MATRIX COLOR DISPLAY WITH MULTIPLE CELLS AND CONNECTION THROUGH SUBSTRATE

RELATED APPLICATION

This is a Continuation-in-Part of U.S. patent application Ser. No. 07/944,207 filed on Sep. 11, 1992 now U.S. Pat. No. 5,444,557 which is a Continuation-in-Part of U.S. Ser. No. 07/823,858 filed on Jan. 22, 1992, abandoned and continued as U.S. Ser. No. 08/153,259 now issued as U.S. Pat. No. 5,420,055, and is also a Continuation-in Part of patent application Ser. No. 07/872,297, filed Apr. 22, 1992, now U.S. Pat. No. 5,317,436 which is a Continuation-in-Part of U.S. patent application Ser. No. 07/636,602, filed Dec. 31, 1990, now U.S. Pat. No. 5,206,749, all of which are incorporated herein by reference.

BACKGROUND OF THE INVENTION

Flat-panel displays are being developed which utilize liquid crystals to produce high quality images. These displays are expected to supplant cathode ray tube (CRT) technology and provide a more highly defined television picture. The most promising route to large scale high quality liquid crystal displays (LCDs), for example, is the active-matrix approach in which thin-film transistors (TFTs) are co-located with LCD pixels. The primary advantage of the active matrix approach using TFTs is the elimination of cross-talk between pixels, and the excellent grey scale that can be attained with TFT-compatible LCDs.

Flat panel displays employing LCDs generally include five different layers: a white light source, a first polarizing filter that is mounted on one side of a circuit panel on which the TFTs are arrayed to form pixels, a filter plate containing at least three primary colors arranged into pixels, and finally a second polarizing filter. A volume between the circuit panel and the filter plate is filled with a liquid crystal material. This material will rotate the polarization of light when an electric field is applied across it between the circuit panel and a ground affixed to the filter plate. Thus, when a particular pixel of the display is turned on, the liquid crystal material rotates polarized light being transmitted through the material so that it will pass through the second polarizing filter.

SUMMARY OF THE INVENTION

The present invention relates to the use of stacked active matrix arrays utilizing thin film transistors in a single crystal material to provide improved transmission color display panels. A preferred embodiment of the invention includes three active matrix arrays where each array controls transmission of light through a separate layer of liquid crystal material. The three layers or cells are vertically registered to form a subtractive color display. Drive circuitry for each of the three active matrix arrays can be formed in the thin film of single crystal material in which the TFTs are formed. Each array and its drive circuitry is transferred onto a glass substrate during fabrication. The drive circuitry on each layer can be electrically or optically interconnected with the other layers of the display. A plurality of such displays can be fabricated and can be optionally separated to form separate displays.

Another preferred embodiment utilized an active matrix formed on two sides of a single substrate to control two layers of liquid crystal material. The drive circuitry for both layers can be interconnected through the substrate. The use of two active matrix arrays mounted on opposite sides of a single substrate can also be stacked with a third active matrix array to provide a three cell structure.

Another preferred embodiment includes two active matrix arrays mounted on opposite sides of a single layer of liquid crystal material so that both arrays can be used to control light transmission through the layer. Each pixel electrode on one side of the liquid crystal material has a pixel electrode aligned on the opposite side of the liquid crystal material. This permits control of the electric field along three different axes. This also permits control of the field strength to adjust greyscale and field direction. By controlling the electric field in three directions, the electric field can be used to select the color.

BRIEF DESCRIPTION OF THE DRAWINGS

The above, and other features of the invention including various novel details of construction and combination of parts, will now be more particularly described with reference to the accompanying drawings and that pointed out in the claims. It will be understood that the particular panel display and the methods used in fabricating those panels which embody the invention are shown by way of illustration only and not as a limitation of the invention. The principal features of this invention can be employed in various embodiments without departing from the scope of the invention.

DETAILED DESCRIPTION

Figure 1:
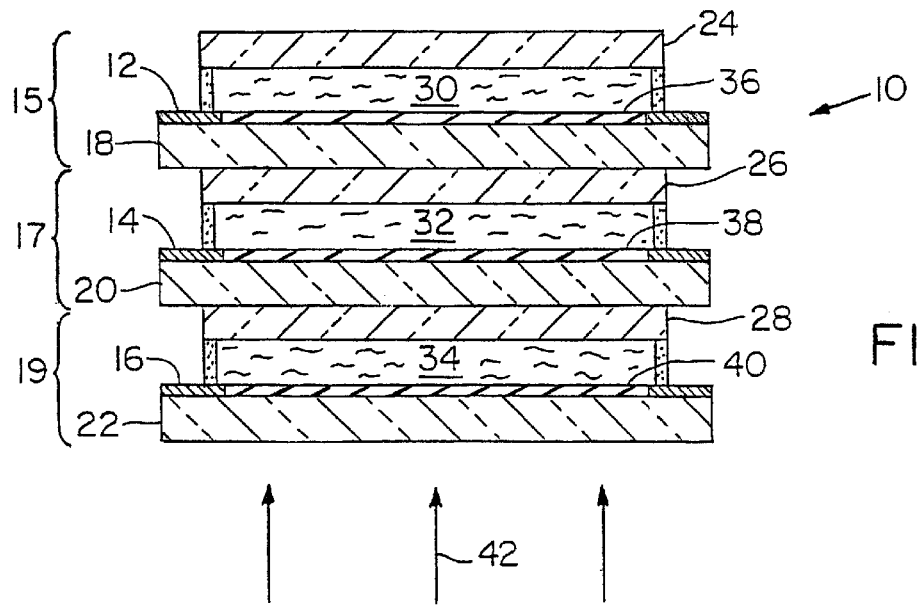
FIG. 1 is a cross-sectional view of a subtractive color display in accordance with the invention.

A preferred embodiment of the invention is illustrated in the cross-sectional view of FIG. 1 of a substractive color display 10. The display 10 includes three levels 15, 17, 19 or cells, where each cell has an active matrix 36, 38, 40 and a liquid crystal material 30, 32, 34, respectively.

The active matrix for each level operates in the manner described in greater detail in U.S. Pat. application Ser. No. 07/872,297 filed on Apr. 22, 1992. The three liquid crystal levels 30, 32, 34 where each contain a dye. Cell 15, for example, can contain a magenta dye, cell 17 can contain a cyan dye and cell 19 can contain a yellow dye. Other colors can also be used to provide a substractive color system. By stacking the three levels in serial registration, the cells form a subtractive full color active matrix display in which single crystal or essentially single crystal layers of silicon are used in each active matrix area to provide the pixel and circuits and electrodes of each pixel element of the display. The peripheral regions 12, 14, 16 of each single crystal layer, in which the active matrix of thin film transistors is also formed, contains CMOS driver circuitry to drive the rows and columns of each active matrix.

The upper cell 15 has liquid crystal material 30 sandwiched between upper transmissive superstrate 24 and substrate 18. The middle cell 17 has upper superstrate 26 and substrate 20 and the lower cell 19 has superstrate 28 and substrate 22. A broad band light source directs light 42 through substrate 22. Each cell, in selective combination with the other cells can remove selected spectral bands of light from incident light 42 to produce a selected image exiting the display at superstrate 24. Polarizing plates (not shown) are inserted into the stack of cells to define the polarization of light being transmitted through display 10.

Figure 2A:
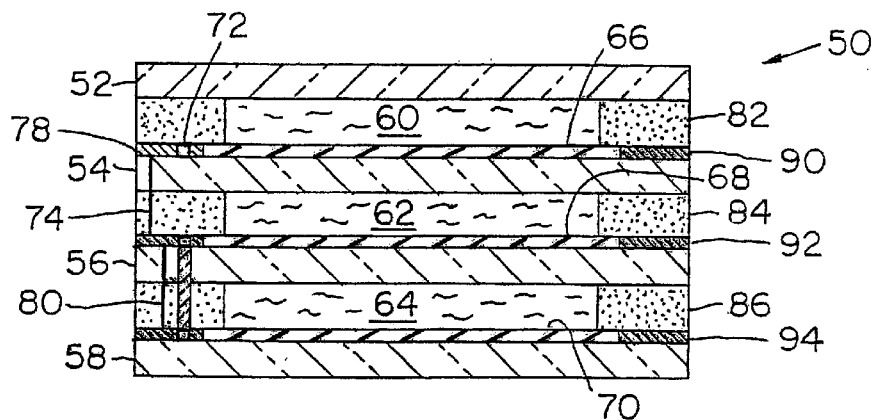
FIGS. 2A and 2B are cross-sectional views of additional preferred embodiments of subtractive color displays.
Figure 2B:
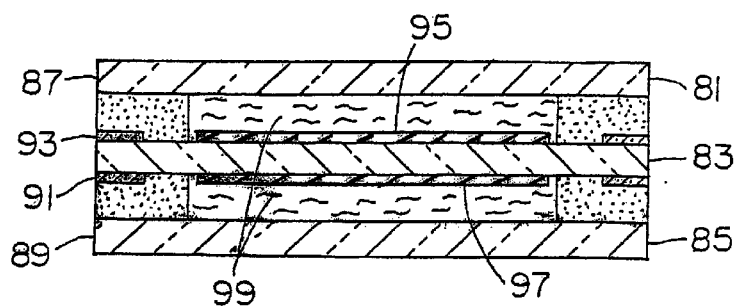

Another preferred embodiment is illustrated in FIG. 2 where a three layer stack of cells is formed. Three layers of liquid crystal material 60, 62, and 64 are positioned adjacent to three active matrix arrays 66, 68, and 70, respectively. An adhesive can be used to join the three cells at 82, 84 and 86, respectively.

Electrical and/or optical interconnects can be used in drive circuit layer elements 90, 92 and 94 formed on both sides of the display. For example, electrical interconnect 78 serves to electrically connect circuit 90 and 92. Electrical interconnect 80 is used to electrically connect circuit elements 92 and 94. Additionally, light emitting and detector elements 72, 74 and 76 can be formed in or on circuits 90, 92 and 94, respectively. The light emitting components can be LED's, lasers, or electroluminescent elements for example. The light from elements 72, 74 and 76 can be conducted through substrates 54, 56 and adhesive layers 82, 84 and 86. Optical waveguides such as optical fibers 88 or fiber optic plates can also be used.

A further embodiment is shown in FIG. 2A where two active matrix arrays 95, 97 are formed on opposite side of substrate 83. The matrix arrays 95, 97 can be formed along with peripheral drive circuitry 93 and 91, respectively, in thin films of single crystal silicon and transferred onto opposite sides of substrate 83 using techniques described in the above referenced related applications.

Optically transmissive superstrates 81 and 85 can then be secured by an adhesive to substrate 83 to form cavities in which a liquid crystal material 99 can be inserted. The material 99 in each cavity can contain different colors to provide a multicolor display.

A third active matrix can be aligned over superstrate 81 to provide a third cavity in which a third color liquid crystal material can be inserted to provide a full color display.

A process sequence is shown in FIGS. 3A–3E for forming a plurality of subtractive color displays on a single semiconductor wafer or substrate.

Figure 3A:
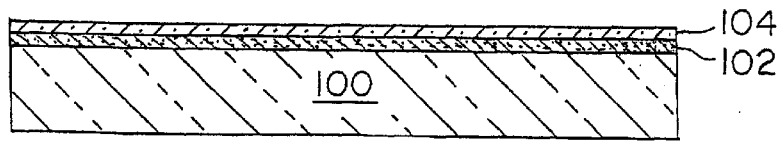
FIGS. 3A–3E illustrate a process sequence for fabricating a subtractive color display in accordance with the invention.

A single crystal silicon substrate 100 is provided as shown in FIG. 3A on which an insulating layer 102, such as an oxide, is formed. A single crystal silicon layer 104 can be formed over the oxide 102 by several known processes including recrystallization of an amorphous or polycrystalline silicon layer.

Figure 3B:
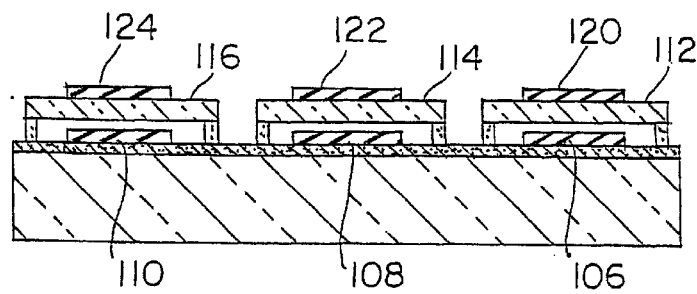
Figure 3C:
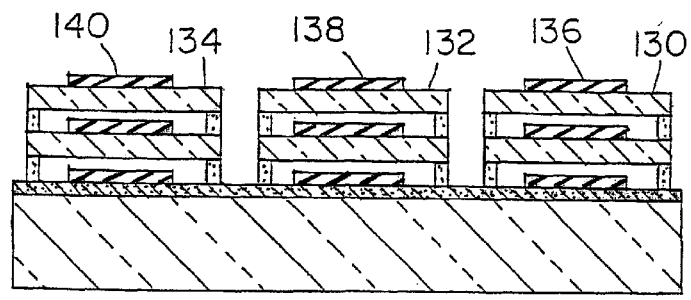
Figure 3D:
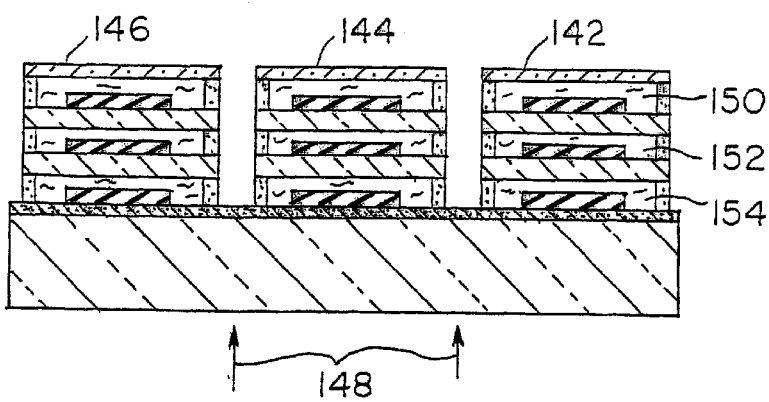
Figure 3E:
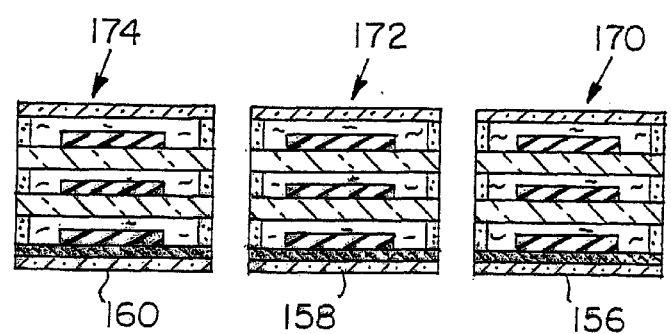

Active matrix elements 106, 108 and 110 are formed in layer 104 as shown in FIG. 3B. Drive circuitry (not shown) can also be formed in layer 104 for each active matrix of each display as described in connection with FIG. 2A. A second level of active matrix elements 120, 122 and 124 are formed, and transferred onto optically transmissive substrates 112, 114 and 116 which are aligned over matrix elements 106, 108 and 110. A third level of active matrix elements 136, 138 and 140 are formed and transferred onto substrates 130, 132 and 134 as shown in FIG. 3C. matrix elements 136, 138 and 140 are aligned with underlying matrix elements. Optically transparent superstrates 142, 144 and 146 are then mounted over each display as shown in FIG. 3D. Cavities 150, 152 and 154 have been provided during fabrication in which liquid crystal material can be inserted either just after cavity formation or after further processing of the display. Substrate 100 can then be removed by an etching procedure 148 described in the above referenced parent applications. All three displays can then be mounted on a single substrate to form a multi display system, or as shown in FIG. 3E, separate displays 170, 172 and 174 can be mounted on transparent substrates 156, 158 and 160.

Figure 4:
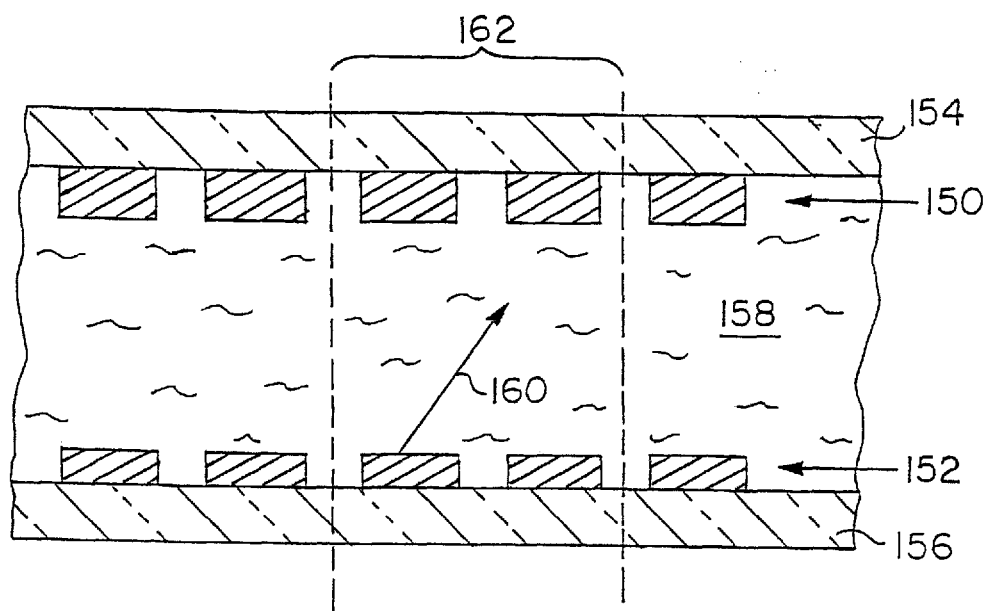
FIG. 4 is a cross-sectional view of multiple active matrix display.

Another preferred embodiment of the invention relates to an improvement in liquid crystal display employing two active matrix arrays on opposite sides of a liquid crystal material as illustrated in FIG. 4.

Standard displays limit the electric field to directions perpendicular to the electrodes of the display. In such a pixel, the polarization can be rotated by hanging the potential across the electrodes. This yields only one degree of freedom in the control of light through the pixel. Usually, this degree of freedom is used to control greyscale. FIG. 4 illustrates a system that broadens the number of degrees of freedom in the electric field to three where a second active matrix 150 is aligned opposite the first active matrix 152 around liquid crystal 158. The active matrix arrays 150 and 152 are mounted onto transparent substrates 154 and 156 respectively. Each display pixel 162 comprises six electrodes (two shown) which can be biased to create an electric field that has components in three axes. Thus, in addition to electric field strength (which can be used to control greyscale), the field direction can be altered.

Figure 5:
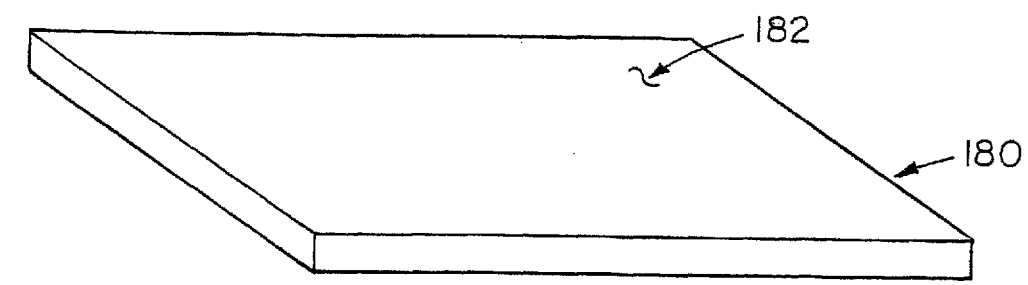
FIG. 5 illustrates a method of using a double active matrix system for a color display.
Figure 5:
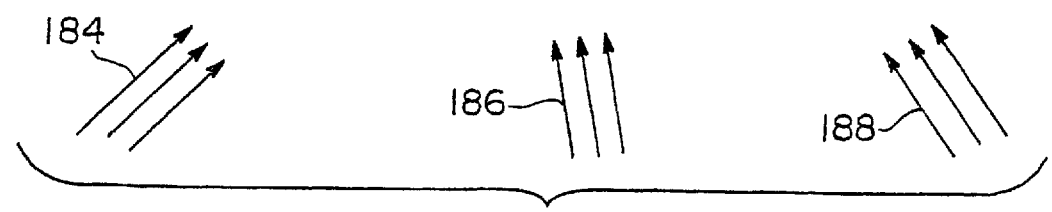

The three degrees of freedom in the electric field can be used to select colors, and thereby transform a single monochrome display cell into a color display cell. FIG. 5 illustrates one way in which this can be achieved. Three polarized light sources 184, 186 and 188 (red, green, and blue) are oriented such that the light approaches the LCD 180 in orthogonal directions. The display cell has a top diffuser 182. The electric field is then oriented so that it is parallel to one of the colors and perpendicular to the other colors, and in this way selects the light source. By shifting to other orthogonal directions, other light sources can be selected. By appropriately choosing an intermediate direction with components is all directions, a particular color can be selected.

The field direction is determined by the relative potentials applied to the electrodes. The field strength (the magnitude of the components) can be adjusted without changing the relationship between the potentials and thus without changing the field direction. Thus, greyscale and color selection can be attained.

This type of color display pixel has advantages over the color filter approach, the main advantage is that the pixel has much higher aperture, owing to the separation of light into components before incidence on the LCD. For example, in a conventional color filter LCD, white light is equally incident on red, green, and blue filters. Each filter receives one third of the incident light, and each filters out an additional two-thirds in the full-on condition. For example, the blue filter rejects all incident red and green light, making the best-case throughput 33%. Thus, in the full on state, the color filter approach has an optical throughput of 33%. For single color operation, the throughput is one third, or 11%. The pixel system described here has a throughput of 33% for single color operation and about 70% for the full on condition.

The double matrix approach has other advantages when used in conventional approach. These include (1) enhanced greyscale, (2) enhanced reliability and (3) enhanced contrast ratio. In addition, the second matrix 150 can be used to correct for nonuniformities, or to add an overlay of a second image onto a first image generated by the first active matrix 150.

Equivalents

While this invention has been particularly shown and described with reference to preferred embodiments thereof, it will be understood by those skilled in the art that various changes in form and details may be made therein without departing from the spirit and scope of the invention are defined by the appended claims.

I claim:

1. A liquid crystal subtractive color display comprising:

a first active matrix array of first pixel SOI circuits and first pixel electrodes, the first pixel circuits being formed in a first thin film of single crystal silicon that is bonded to a first optically transmissive substrate with and adhesive layer;

a first driver circuit formed with the first thin film of single crystal silicon that is bonded to the first optically transmissive substrate, the first driver circuit having a row driver and a column driver;

a second active matrix array of second pixel SOI circuits and second pixel electrodes, the second pixel electrodes, the second pixel circuits being formed in a second thin film of single crystal silicon and bonded to a second optically transmissive substrate with an adhesive layer, the second active matrix array being aligned with the first active matrix array;

a second circuit formed with the second thin film of single crystal silicon that is bonded to the second optically transmissive substrate, the second driver circuit having a second row driver and a second column driver;

an interconnect between the first driver circuit and the second driver circuit that extends through the second optically transmissive substrate; and a first layer of liquid crystal material actuated by the first active matrix and a second layer of liquid crystal material actuated by the second active matrix to provide a subtractive color liquid crystal display.

2. The liquid crystal display of claim 1 further comprising a third active matrix array having third pixel circuits and third pixel electrodes, the third active matrix array being formed in a third thin film of single crystal silicon.

3. The liquid crystal display of claim 2 further comprising a third layer of liquid crystal material adjacent the third active matrix.

4. The liquid crystal display of claim 2 further comprising a third driver circuit formed in the third thin film of single crystal silicon.

5. The liquid crystal display of claim 1 further comprising an optical interconnect circuit between the first active matrix and the second active matrix.

6. A method of making a liquid crystal subtractive color driver comprising:

forming a first active matrix array of first pixel SOI circuits, second driver circuits and first pixel electrodes, the first pixel circuits and first driver circuits being formed in a first thin film of single crystal silicon that is bonded to a first optically transmissive substrate;

forming a second active matrix array of second pixel SOI circuits, second driver circuits and second pixel electrodes, the second pixel circuits and second driver circuits being formed in a second thin film of single crystal silicon that is bonded to a second optically transmissive substrate;

aligning the second active matrix array over the first active matrix array to form a stacked display structure;

interconnecting the first driver circuit and the second driver circuit with an interconnect extending through the second optically transmissive substrate such that the first driver circuit drives the first pixel SOI circuits and the second driver circuit drives the second pixel SOI circuits; and positioning a first layer of liquid crystal material in a cavity adjacent to by the first active matrix and positioning a second layer of liquid crystal material adjacent to the second active matrix to provide a subtractive color liquid crystal display.

7. The method of claim 6 further forming a third active matrix array having third pixel circuits and third pixel electrodes, the third active matrix array being formed in a third thin film of single crystal silicon.

8. The method of claim 7 further comprising positioning a third layer of liquid crystal material adjacent the third active matrix.

9. The method of claim 7 further comprising forming the first active matrix array with a thin film of single crystal silicon over an insulating substrate and transferring the single crystal material onto the first optially transmissive substrate.

10. The method of claim 6 further comprising forming an optical interconnect circuit between the first active matrix and the second active matrix.

11. A method of making a liquid crystal subtractive color display comprising:

providing a light source;

forming a first active matrix array of first pixel circuits, a first SOI driver circuit and first pixel electrodes, the first driver and the first pixel circuits being formed in a first thin film of single crystal silicon that is bonded to a first optically transmissive substrate with an adhesive layer to provide a first display element;

forming a second active matrix array of second pixel circuits, a second SOI driver circuit, and second pixel electrodes, the second driver circuit and the second pixel circuits being formed in second thin film of single crystal silicon and bonded to a second optically transmissive substrate with a second adhesive layer to provide a second display element;

aligning the second active matrix over the first active matrix array and bonding the first display element to the second display element with a third adhesive layer to form a stacked display structure;

interconnecting the first SOI driver circuit and the second SOI driver circuit with an interconnect extending through the second optically transmissive substrate; and positioning a liquid crystal material in a cavity adjacent to the first active matrix and positioning a second layer of liquid crystal material adjacent to the second active matrix to provide a color liquid crystal display that is optically coupled to the light source.

12. The method of claim 11 further forming a third active matrix array having third pixel circuits and third pixel electrodes, the third active matrix array being formed in a third thin film of single crystal silicon.

* * * * *